United States Patent [19]

Franz

[11] Patent Number: 5,387,806
[45] Date of Patent: Feb. 7, 1995

[54] GTO-THYRISTOR

[75] Inventor: Guenther Franz, Munich, Germany

[73] Assignee: Siemens Aktiengesellschaft, Munich, Germany

[21] Appl. No.: 208,814

[22] Filed: Mar. 11, 1994

[30] Foreign Application Priority Data

Mar. 25, 1993 [DE] Germany .................... 4309763

[51] Int. Cl.⁶ .................. H01L 29/74; H01L 29/747; H01L 29/743
[52] U.S. Cl. ................... 257/147; 257/151; 257/153; 257/152
[58] Field of Search .......... 257/147, 152, 153, 138, 257/139, 170, 171, 123, 124, 127, 626

[56] References Cited

U.S. PATENT DOCUMENTS 4,388,635  6/1983  Watanabe et al. ............... 257/626
4,618,877 10/1986  Araki et al. ...................... 257/147
4,829,348  5/1989  Brosch et al. .................... 257/171
4,843,449  6/1989  Jaecklin et al. .................. 257/147

FOREIGN PATENT DOCUMENTS 0283588   9/1988  European Pat. Off. .
3708651  10/1987  Germany .
59-36964  2/1984  Japan .............................. 257/170

Primary Examiner—Rolf Hille
Assistant Examiner—Wael M. Fahmy
Attorney, Agent, or Firm—Hill, Steadman & Simpson

[57] ABSTRACT

The semiconductor substrate of a GTO-Thyristor is structured at a cathode-side such that the cathode electrode lies in a first uppermost level of and in a second level lying there below. A gate contact lies in a third lowest level. Passivation layers extend only over the second and third levels. The cathode electrode also contacts the cathode emitter zone in the second level. It is overlapped there by the passivation layers.

11 Claims, 1 Drawing Sheet

GTO-THYRISTOR

BACKGROUND OF THE INVENTION

The present invention is directed to a GTO-Thyristor having a semiconductor substrate whose cathode-side surface has three levels or planes lying at different heights.

Prior art GTO-Thyristors have:

(a) at least one cathode electrode, each of which contacts a cathode zone, arranged on the first uppermost level;

(b) a pn-junction of the cathode zone that comes to the surface in the second level, the second level lying under the first level;

(c) at least one gate electrode arranged on the third lowest level; and (d) a first insulating layer covering the pn-junction and a second insulating layer covering at least a part of the first insulating layer and at least a part of the gate electrode.

FIG. 2 shows a section through a semiconductor body of such a prior art GTO-Thyristor. The semiconductor substrate 1 contains a p-doped base zone 2 at the cathode-side into which a highly n-doped cathode emitter zone 3 is embedded. The cathode-side surface of the semiconductor body is divided into three levels 4, 5 and 6. A cathode contact 17 that contacts the emitter zone 3 is arranged on the first uppermost level 4. A gate contact 18 lies on the lowest third level 6. This gate contact 18 contacts the base zone 2 via a highly p-doped zone 10. The second level 5 within which the pn-junction comes to the surface between the cathode emitter zone 3 and the base zone 2 lies vertically between the levels 4 and 6. On the first level 4, the cathode electrode 17 overlaps a first insulating layer 21 composed of silicon nitride that extends over all three levels. The insulator level 21 is overlapped by the gate contact 18 on the third level 6. The second insulator layer 22 of, for example, a polyamide, is placed over the gate electrode 18 and over the first insulator layer 22.

The known prior art solution has the disadvantage that the insulation layers 21, 22 extend over all three levels. The edges of the electrodes likewise lie vertically far apart, namely in the first level and in the third level. It is not possible with traditional phototechniques to structure the edges of the layers lying in the first and third level to be edge-sharp. The reason for this is that the depth of field of traditional automatic exposure units is less than the distance between the first level 4 and the third level 6. It is thus often not possible to join the second insulating layer 22 flush to the edge of the cathode electrode 17. Since an overlap is not permitted here, the passivation is incomplete in this region.

SUMMARY OF THE INVENTION

It is an object of the present invention to provide an improved GTO-Thyristor of the type initially set forth such that the layers can be structured with sharp edges and without added outlay and such that a faultless passivation of the surface is achieved.

This object of the present invention is achieved by:

(e) the first insulating layer being applied exclusively in the second level and in the third level;

(f) the cathode electrode also contacting the emitter zone in the second level and overlapping the first insulating layer;

(g) the gate electrode overlapping that part of the first insulating layer lying in the third level; and (h) the second insulating layer overlapping the cathode electrode in the second level.

Advantageous developments of the present invention are as follows. The surface of the second insulating layer lies lower than the surface of the cathode electrode. The gate electrode extends up to the edge of the third level. The three levels have a maximum vertical spacing of 12 $\mu$m.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
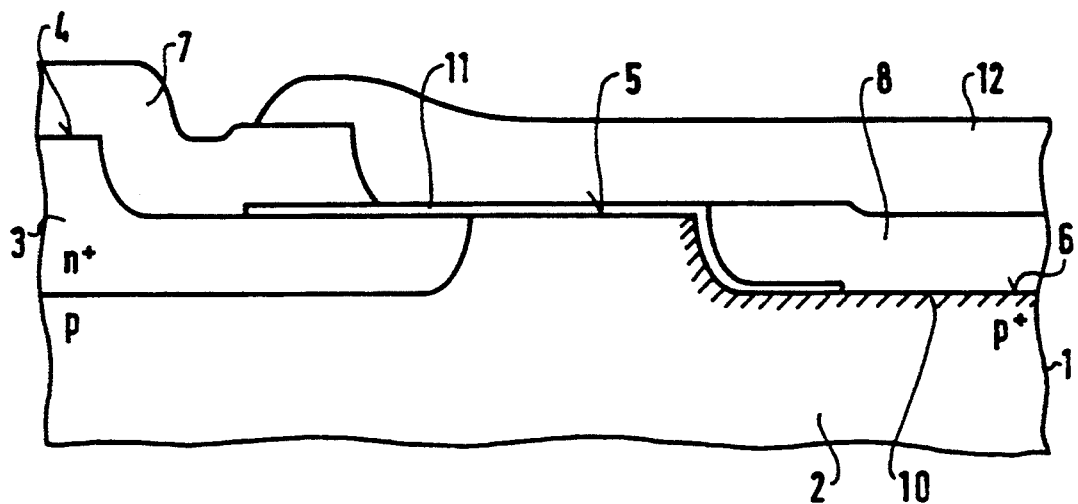
FIG. 1 a cross-sectional view of a GTO-Thyristor according to the present invention.
Figure 2:
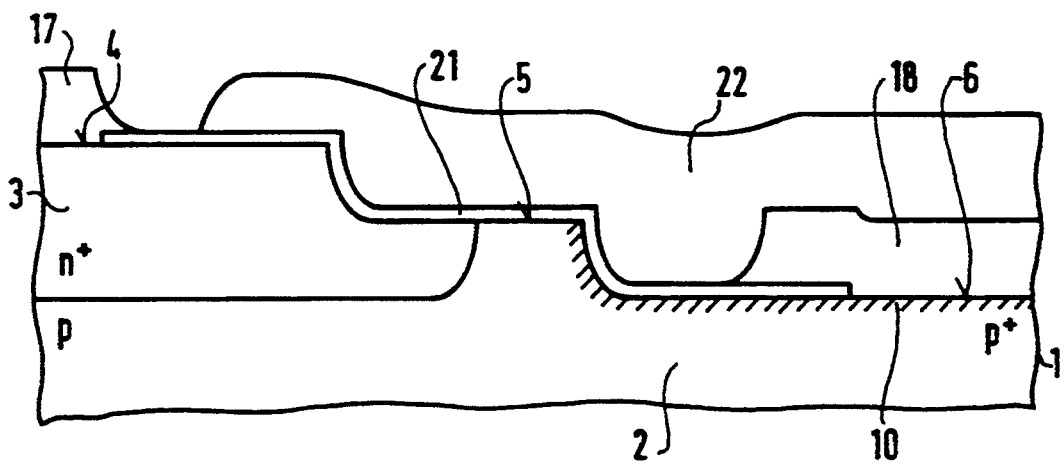
FIG. 2 a cross-sectional view of a prior art GTO-Thyristor.

The GTO-Thyristor of the present invention is depicted in FIG. 1. The cathode electrode 7 contacts the cathode emitter zone 3 both in the first level 4 and in the second level 5 of the semiconductor substrate 1. A first insulating layer 11 is provided on the second level 5, this first insulating layer 11 covering the pn-junction between the cathode emitter zone 3 and the base zone 2. The cathode electrode 7 overlaps the first insulating layer 11 on the second level 5 and ends before the pn-junction. The insulating layer 11 extends up into the third level 6. The base zone 2 is contacted by a gate electrode 8 via the highly p-doped zone 10. A second insulating layer 12 is applied over the first insulating zone 11 and over the gate electrode 8, this second insulating layer 12 overlapping the cathode electrode 7 on the second level 5.

The layers to be structured, namely the electrodes 7 and 8 on the one hand, and the insulating layers 11 and 12 on the other hand, now lie at most in two neighboring levels. When the levels 4, 5, 6 respectively lie a maximum of 12 $\mu$m apart in vertical direction, an exact structuring with traditional automatic exposure units is still possible.

An important advantage of the present invention is that the second insulating layer 12 overlaps the cathode electrode 7, as a result whereof a faultless passivation of the cathode-side surface of the GTO-Thyristor is possible. It is recommendable to set the thickness of the second insulating layer 12 such that its surface lies lower than the cathode electrode 7. This is required for a faultless through-contacting of the GTO-Thyristor.

Another advantage of the present invention is that the gate electrode 8 can be produced with edge precision up to the edge of the depression established by the third level 6. The surface of the second insulating layer can thus be fashioned essentially planarly.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A GTO-Thyristor having a semiconductor substrate whose cathode-side surface has three levels lying at different heights, comprising:
   a cathode zone which surfaces in a first uppermost level and in a second level lying below the first uppermost level, the cathode zone having a pn-junction which surfaces in the second level;
   at least one cathode electrode, which contacts the cathode zone on the first uppermost level and on the second level;
   at least one gate electrode arranged on a third lowest level, the third lowest level lying below the second level;
   a first insulating layer covering the pn-junction and a second insulating layer covering at least a part of the first insulating layer and at least a part of the gate electrode;
   the first insulating layer being exclusively in the second level and in the third lowest level;
   the at least one cathode electrode also contacting an emitter zone in the second level and overlapping the first insulating layer;
   the gate electrode overlapping a part of the first insulating layer lying in the third lowest level; and
   the second insulating layer overlapping the cathode electrode in the second level.

2. The GTO-Thyristor according to claim 1, wherein the gate electrode extends up to an edge of the third lowest level.

3. The GTO-Thyristor according to claim 1, wherein a surface of the second insulating layer lies lower than a surface of the cathode electrode.

4. The GTO-Thyristor according to claim 1, wherein the first uppermost, second level and third lowest level have a maximum vertical spacing of 12 $\mu$m.

5. A GTO-Thyristor comprising:
   a semiconductor substrate having a cathode-side surface with at least three levels lying at different heights;
   at least one cathode electrode contacting a respective cathode zone, said at least one cathode electrode being arranged on a first level that is an uppermost level of said three levels;
   said cathode zone having a pn-junction at a second level, lying below the first level, of said three levels, said cathode zone being in said first and second levels;
   at least one gate electrode arranged on a third level that is a lowest level of said three levels;
   a first insulating layer covering said pn-junction and a second insulating layer covering at least a part of said first insulating layer and at least a part of said gate electrode;
   said first insulating layer being exclusively in said second level and in said third level;
   the cathode electrode also contacting an emitter zone in said second level and overlapping said first insulating layer;
   said gate electrode overlapping a part of said first insulating layer lying in said third level; and
   said second insulating layer overlapping said cathode electrode in said second level.

6. The GTO-Thyristor according to claim 5, wherein said gate electrode extends up to an edge of said third level.

7. The GTO-Thyristor according to claim 5, wherein a surface of said second insulating layer lies lower than a surface of said cathode electrode.

8. The GTO-Thyristor according to claim 5, wherein said first, second and third levels have a combined maximum vertical spacing of 12 $\mu$m.

9. A GTO-Thyristor comprising:
   a semiconductor substrate having a cathode-side surface with at least three levels lying at different heights;
   at least one cathode electrode contacting a respective cathode zone, the at least one cathode electrode being arranged on a first level that is an uppermost level of said three levels;
   said cathode zone having a pn-junction at a second level, lying below the first level, of said three levels; said cathode zone being in said first and second levels;
   at least one gate electrode arranged on a third level that is a lowest level of said three levels;
   a first insulating layer covering said pn-junction and a second insulating layer covering at least a part of said first insulating layer and at least a part of said gate electrode;
   said first insulating layer being exclusively in said second level and in said third level;
   the cathode electrode also contacting an emitter zone in said second level and overlapping said first insulating layer;
   said gate electrode overlapping a part of said first insulating layer lying in said third level;
   said second insulating layer overlapping said cathode electrode in said second level; and
   said first, second and third levels having a combined a maximum vertical spacing of approximately 12 $\mu$m.

10. The GTO-Thyristor according to claim 9, wherein said gate electrode extends up to an edge of said third level.

11. The GTO-Thyristor according to claim 9, wherein a surface of said second insulating layer lies lower than a surface of said cathode electrode.

* * * * *